(12) United States Patent
Tsutsui et al.

(10) Patent No.: US 12,446,320 B2
(45) Date of Patent: Oct. 14, 2025

(54) BOTTOM CONTACT WITH SELF-ALIGNED SPACER FOR STACKED SEMICONDUCTOR DEVICES

(71) Applicant: International Business Machines Corporation, Armonk, NY (US)

(72) Inventors: Gen Tsutsui, Glenmont, NY (US); Albert M. Young, Fishkill, NY (US); Su Chen Fan, Cohoes, NY (US); Junli Wang, Slingerlands, NY (US); Brent A Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 17/655,807

(22) Filed: Mar. 22, 2022

(65) Prior Publication Data
US 2023/0307447 A1    Sep. 28, 2023

(51) Int. Cl.
*H10D 88/00* (2025.01)
*H10D 64/01* (2025.01)
(Continued)

(52) U.S. Cl.
CPC .............. *H10D 88/00* (2025.01); *H10D 64/01* (2025.01); *H10D 64/251* (2025.01); *H10D 84/85* (2025.01)

(58) Field of Classification Search
CPC ............... H01L 27/0688; H01L 27/092; H01L 21/823814; H01L 21/823418;
(Continued)

(56) References Cited

U.S. PATENT DOCUMENTS 7,479,673 B2 *  1/2009  Jang ................. H10B 10/00
                                                    438/153
9,947,804 B1    4/2018  Frougier
(Continued)

OTHER PUBLICATIONS

International Searching Authority, "Notification of Transmittal of the International Search Report and the Written Opinion of the International Searching Authority, or the Declaration", International application No. PCT/EP2023/055905, International Filing Date Mar. 8, 2023, Mailed on Jun. 9, 2023, 12 pages.

*Primary Examiner* — Ajay Ojha
(74) *Attorney, Agent, or Firm* — Randy Tejeda (57) ABSTRACT

An approach forming semiconductor structure composed of one or more stacked semiconductor devices that include at least a top semiconductor device, a bottom semiconductor device under the top semiconductor, and contacts to each of the semiconductor devices. The approach provides a stacked semiconductor structure where the bottom semiconductor device is wider than the top semiconductor device. The approach also provides the stacked semiconductor structure where the width of the top semiconductor device is the same as the width of the bottom semiconductor device. The approach includes forming a contact to a side of the bottom semiconductor device when the width of the top semiconductor device is the same as the bottom semiconductor device. The approach includes forming a contact to epitaxy grown on a portion of the top and a side of the bottom semiconductor device when the bottom semiconductor device is larger than the top semiconductor device.

16 Claims, 4 Drawing Sheets

(51) Int. Cl.
*H10D 64/23* (2025.01)
*H10D 84/85* (2025.01)

(58) Field of Classification Search
CPC ..... H01L 21/823871; H01L 21/823475; H01L 21/8221; H01L 29/401; H01L 29/41725; H10D 84/013; H10D 84/0149; H10D 84/017; H10D 84/0186; H10D 84/038; H10D 84/01; H10D 84/85; H10D 84/851; H10D 84/852; H10D 84/8311; H10D 84/8312; H10D 84/83135; H10D 84/83138; H10D 84/8314; H10D 84/8316; H10D 64/01; H10D 64/251; H10D 88/00; H10D 88/01; H10D 84/02; H10D 84/032; H10D 84/035; H10D 84/05; H10D 84/07; H10D 84/08
See application file for complete search history.

(56) References Cited

U.S. PATENT DOCUMENTS

| | | | |
|---|---|---|---|
| 10,164,121 B2 | 12/2018 | Hatcher | |
| 10,297,513 B1* | 5/2019 | Yamashita | H01L 29/0847 |
| 10,707,304 B2 | 7/2020 | Reznicek | |
| 10,896,851 B2 | 1/2021 | Cheng | |
| 11,069,684 B1 | 7/2021 | Xie | |
| 11,158,544 B2 | 10/2021 | Cheng | |
| 11,164,791 B2 | 11/2021 | Wu | |
| 11,195,832 B2 | 12/2021 | Gardner | |
| 11,201,153 B2 | 12/2021 | Xie | |
| 2018/0277442 A1* | 9/2018 | Leobandung | H10D 88/01 |
| 2019/0393214 A1* | 12/2019 | Lilak | H01L 21/823431 |
| 2020/0273755 A1* | 8/2020 | Wu | H01L 21/76897 |
| 2020/0365464 A1 | 11/2020 | Sreenivasan | |
| 2023/0116288 A1* | 4/2023 | Kim | H01L 27/092 257/401 |

* cited by examiner

FIG. 1 (top view)

FIG. 2 (cross-section A-A)

FIG. 3 (top view)

FIG. 4 (cross-section B-B)

BOTTOM CONTACT WITH SELF-ALIGNED SPACER FOR STACKED SEMICONDUCTOR DEVICES

BACKGROUND OF THE INVENTION

The present invention relates generally to the field of semiconductor memory device technology and more particularly to a bottom device contact with a self-aligned spacer in stacked field-effect transistors.

Improving the density of semiconductor devices in a semiconductor chip is desirable both to increase the number of devices per semiconductor chip and to increase the semiconductor chip performance. Theoretically, increasing the number of semiconductor devices in the semiconductor chip could increase the chip size and with less chips per wafer may increase semiconductor chip cost. By closely packing semiconductor devices in the semiconductor chip or by stacking logic and/or memory devices, the density of the devices in the semiconductor chip increases to reduce semiconductor chip size. Additionally, as logic and memory devices are closer in the semiconductor chip, signals may travel less distance between devices to improve semiconductor chip performance.

One emerging trend to improve device density is to stack logic and memory devices. Vertically aligning logic or memory devices, such as field-effect transistors can consume less surface area than placing transistors adjacent to each other. Stacking semiconductor device one under another can reduce the semiconductor chip area utilized by the transistors and provides an ability to form smaller semiconductor chips with the same number of devices.

SUMMARY

Embodiments of the present invention provide a semiconductor structure composed of stacked semiconductor devices that includes at least a top semiconductor device on a dielectric material layer and a bottom semiconductor device under the top semiconductor where the bottom semiconductor device is larger than the top semiconductor device. Embodiments of the present invention provide a top contact connecting to a portion of the top surface of the top semiconductor device and a bottom contact connecting to a portion of the top surface and the side of the bottom semiconductor device when the bottom semiconductor device is larger than the top semiconductor device. Embodiments of the present invention provide the stacked semiconductor structure where a layer of epitaxy resides on the portions of the top surface and the side of the bottom semiconductor device. In these embodiments, the layer of epitaxy connects the bottom semiconductor device to the bottom contact. Embodiments of the present invention provide the semiconductor structure composed of stacked semiconductor devices where the stacked semiconductor devices are logic semiconductor devices, memory semiconductor devices, or a combination of memory and logic devices.

Embodiments of the present invention disclose a semiconductor structure and a method of forming the semiconductor structure with stacked semiconductor devices where the width of the top semiconductor device is the same as the width of the bottom semiconductor device. When the stacked semiconductor devices have the same size, embodiments of the present invention disclose a method and structure to form a bottom contact connecting to a layer of epitaxy grown on a portion of a side of the bottom semiconductor device. In these embodiments, the bottom portion of the bottom contact to the bottom semiconductor device is wider than the top portion of the bottom contact.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Embodiments of the present invention recognize that when forming two vertically aligned and stacked semiconductor devices with a relatively tight device pitch between adjacent stacked semiconductor devices, the bottom semiconductor device is only marginally larger than the top semiconductor device in order to achieve the tight pitch between stacked semiconductor devices. Embodiments of the present invention recognize that when the bottom semiconductor device is only marginally larger than the top semiconductor device, then the contact area for the connection to the top surface of the bottom semiconductor device is small. When the contact area and the bottom contact are small, the contact resistance of the bottom contact is high. Embodiments of the present invention recognize that a method of forming stacked semiconductor devices with bottom contacts that provide a low contact resistivity is desirable.

Embodiments of the present invention recognize that a method of forming vertically stacked semiconductor devices with a larger bottom contact area connecting to the bottom semiconductor devices would improve the electrical performance of the semiconductor chip and the stacked semiconductor devices. Embodiments of the present invention recognize that the stacked semiconductor structure with larger bottom contacts that have an increased contact area with the bottom semiconductor device can provide a lower bottom contact resistance resulting in improved semiconductor device performance.

Embodiments of the present invention disclose both stacked semiconductor structures with the same sized top and bottom semiconductor devices and stacked semiconductor structures with a smaller top semiconductor device and a larger bottom semiconductor device. While embodiments of the present invention discuss the stacked semiconductor structures and methods of forming the stacked semiconductor structures in terms of field-effect transistors (FET), the embodiments of the present invention are not limited to FET stacked devices but apply to stacked memory devices or a combination of stacked logic and memory devices as well.

Embodiments of the present invention provide stacked semiconductor devices that have a bottom contact to the bottom semiconductor that connects directly to the bottom semiconductor device or connects through a layer of epitaxy on the bottom semiconductor device. The layer of epitaxy can be heavily doped to further improve the electrical performance of the stacked semiconductor devices by reducing the contact resistance to the bottom device.

Embodiments of the present invention disclose a method to form the stacked semiconductor structures with a smaller top semiconductor device and a larger bottom semiconductor device. The method includes forming a recess in layers of interlayer dielectric material (ILD) adjacent to the stacked semiconductor device. The recess can be through a layer of dielectric material residing between the top and bottom semiconductor devices. The recess exposes a portion of the top surface of the bottom semiconductor device and a side of the bottom semiconductor device. A layer of epitaxy may be grown on the exposed surfaces of the bottom semiconductor device. The method includes forming a second recess above the top semiconductor device and depositing a contact material in the recesses.

Embodiments of the present invention provide a method to form a stack of semiconductor devices with the same width and the same shape (e.g., the same cross-sectional area) such that one semiconductor device is completely under another semiconductor device. In these embodiments, a lateral etch of the interlayer dielectric material allows a connection or contact to the side or vertical edge of the bottom semiconductor device after contact material deposition.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for semiconductor chips, and only so much of the commonly practiced process steps are included as are necessary for an understanding of the described embodiments. The figures represent cross-section portions of the semiconductor chip with one or more vertically stacked semiconductor devices after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

Deposition processes as used herein include but are not limited to chemical vapor deposition (CVD), plasma-enhanced chemical vapor deposition (PECVD), atomic layer deposition (ALD), ionized plasma vapor deposition (iPVD), plasma vapor deposition (PVD), gas cluster ion beam (GCIB) deposition, electroplating, but may not be limited these known semiconductor deposition processes.

Removing or etching as used herein includes but is not limited to patterning using one of lithography, photolithography, an extreme ultraviolet (EUV) lithography process, or any other known semiconductor patterning process followed by one or more the etching processes. Various materials are referred to herein as being removed or "etched" where etching generally refers to one or more processes implementing the removal of one or more materials. In some cases, the removal of a material in an area occurs while leaving other protected areas of materials that are masked during the lithography processes unaffected. Some examples of etching processes include but are not limited to the following processes, such as a dry etching process using a reactive ion etch (RIE) or ion beam etch (IBE), a wet chemical etch process or a combination of these etching processes. A dry etch may be performed using a plasma. Plasma systems can operate in several modes by adjusting the parameters of the plasma. Ion milling, sputter etching, or reactive ion etching (RIE) bombards the wafer with energetic ions of noble gases that approach the wafer approximately from one direction, and therefore, these processes are anisotropic or a directional etching process.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the growth surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Doping of epitaxially grown materials such as adding boron, phosphorous, or other materials can occur during epitaxial growth using known doping methods.

References in the specification to "one embodiment", "other embodiment", "another embodiment", "an embodiment", etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

Figure 1:
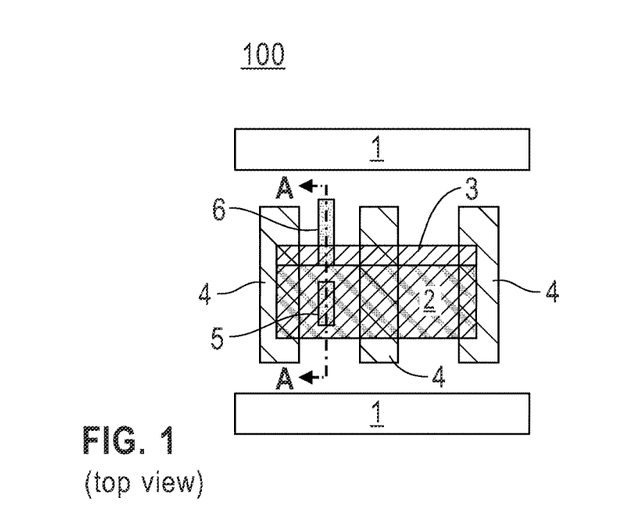
FIG. 1 is a top isometric view of a semiconductor structure after forming contacts to two stacked field-effect transistors (FETs) in accordance with an embodiment of the present invention.

FIG. 1 is a top isometric view of semiconductor structure 100 after forming contacts 5 to top FET 2 and contact 6 to bottom FET 3 in accordance with an embodiment of the present invention. FIG. 1 is one example of an illustration of a top isometric view of semiconductor structure 100 looking through the ILD layers (e.g., above and below top FET 2), and through the dielectric material separating top FET 2 and bottom FET 3. As depicted, FIG. 1 includes power rail 1, top FET 2, bottom FET 3, gates 4, top contact 5, and bottom contact 6 as seen through the ILD layers and dielectric material. Bottom contact 6 is separated from top FET 2 by a thin layer of the dielectric material and a sidewall spacer that is not depicted in FIG. 1.

In various embodiments, top FET 2 and bottom FET 3 may be any other type of field-effect transistor. For example, top FET 2 and bottom FET 3 can be a finFET, a vertical-transport field-effect transistor (VTFET), vertical FET (VFET), metal-oxide-semiconductor field-effect transistor (MOSFET), or any other type of logic device. In some embodiments, top FET 2 and bottom FET 3 are different types of FETs (e.g., finFET and a VFET). In various embodiments, top FET 2 and bottom FET 3 are the same type of logic devices (e.g., both are FETs). In an embodiment, more than two FETs are stacked. In another embodiment, more than one or more FETs are stacked with one or more memory devices. In various embodiments, bottom FET 3 can be ten to thirty percent wider than top FET 2 but is not limited to these size differences. In other embodiments, a memory device can replace either or both of top FET 2 and/or bottom FET 3. For example, a dynamic random-access memory (DRAM) cell can replace top FET 2 above bottom FET 3.

In various embodiments, top FET 2 is a one of an n-doped FET (NFET), a p-doped FETs (PFET), or is an undoped FET. As known to one skilled in the art, in other embodiments, the top semiconductor device, top FET 2, can be an n-type (NFET) device, and bottom FET 3 can be a p-type or p-doped (PFET) device or vice versa. Similarly, bottom FET 3 may be an n-doped FET (NFET), a p-doped FETs (PFET), or is undoped. In various embodiments, top FET 2 and bottom FET 3 may be formed in a middle of the line (MOL) and/or in a front-end of the line (FEOL) layer. In other cases, top FET 2 and bottom FET 3 may be formed in a back end of the line (BEOL) layer.

While the stacked semiconductor devices are discussed as top FET 2 and bottom FET 3 with respect to FIGS. 1-16, in other embodiments, the top semiconductor device labelled top FET 2 and the bottom semiconductor device labelled bottom FET 3 of FIG. 1 are memory devices (e.g., a top memory device and a bottom memory device). The semiconductor devices labelled "2" and "3" can be any type of suitable memory device (e.g., static random access (SRAM), phase-change RAM (PCRAM), magnetoresistive RAM (MRAM), etc.). For example, when stacked memory devices are formed, the top device labelled "2" and the bottom device labelled "3," may be formed in one of the MOL or the BEOL.

Power rail 1 and gates 4 can be any conventionally formed power rail or gate. In an embodiment, power rail 1 may not be present. Contact 5 and contact 6 may be composed of any electrically conductive contact material. For example, contact 5 and contact 6 may be composed of but not limited to titanium (Ti), titanium nitride (TiN), cobalt (Co), or tungsten (W).

Figure 2:
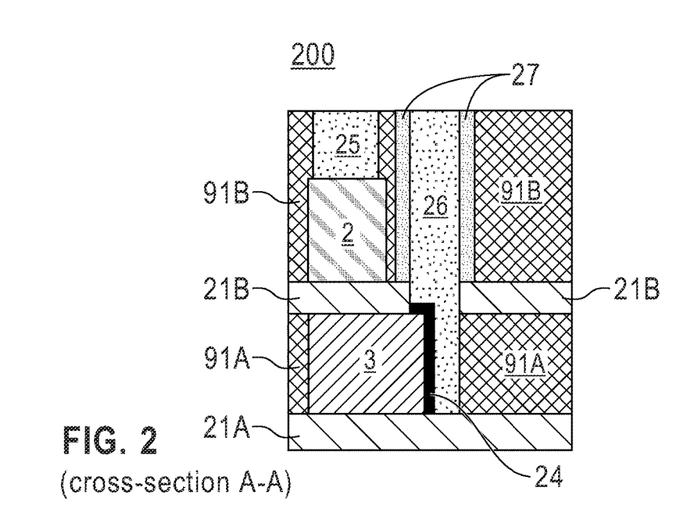
FIG. 2 is a cross-sectional view through A-A of the semiconductor structure of FIG. 1 in accordance with an embodiment of the present invention.

FIG. 2 is a cross-sectional view 200 through A-A of semiconductor structure 100 of FIG. 1 in accordance with an embodiment of the present invention. As depicted, FIG. 2 includes dielectric layer 21A, dielectric layer 21B, bottom FET 3, epi 24, top FET 2, top contact 25, bottom contact 26, sidewall spacer 27, ILD 91A, and 91B. Top contact 25, and bottom contact 26 can be essentially the same as or similar to top contact 5, and bottom contact 6 as previously discussed with reference to FIG. 1. Dielectric layers 21A and 21B may be composed of but, not limited to SiN or a low-k dielectric material, such as SiBCN, SiOCN, SiCOH, etc. In some embodiments, dielectric layers 21A and 21B are composed of the same dielectric material. In other embodiments, dielectric layers 21A and 21B are composed of different dielectric materials.

As depicted in FIG. 2, a thin layer of ILD 91B may be present between top FET 2 and sidewall spacer 27. In one embodiment, the thin layer of ILD 91B is not present between top FET 2 and sidewall spacer 27 (depicted in FIG. 1). In this case, sidewall spacer 27 is composed of a thick layer of a dielectric material. Sidewall spacer 27 can be formed using known sidewall spacer processes in an etched recess of ILD 91B. Sidewall spacer 27 can be composed of any type of sidewall spacer material such as silicon nitride (SiN) or a low-k dielectric material. Sidewall spacer 27 may be separated from ILD 91A by dielectric layer 21B. ILD 91A and 91B can be any ILD material such as $SiO_2$, $Si_2O_3$, etc.

Epi 24 can be a doped epi material that is grown on exposed surfaces of bottom FET 3 after etching a recess for the bottom contact. Epi 24 can provide a low resistivity for the connection of bottom FET 3 with bottom contact 26. Epi 24 may be a heavily doped layer of silicon, grown and doped using known epitaxial processes. For example, if bottom FET 3 is a PFET, epi 24 may be heavily doped with boron. When bottom FET 3 is an NFET, epi 24 may be heavily doped with phosphorous. In other examples, a different semiconductor doping material may be used to dope epi 24.

As depicted in FIG. 2, bottom FET 3 is larger than top FET 2 and top contact 25 is narrower than bottom contact 26. In some cases, top contact 25 and bottom contact 26 may have the same width. In FIG. 2, the vertical sides of bottom contact 26 are straight and a portion of the bottom surface of bottom contact 26 resides on top of bottom FET 3, and the rest of the bottom portion or surface of bottom contact 26 resides on dielectric layer 21A which is the dielectric material below bottom FET 3.

As depicted, bottom contact 26 is wider and can have a larger cross-sectional area than conventionally formed bottom contacts in conventional stacked FETs. The conventionally formed bottom contacts connect only to a small portion of the top surface of the bottom FET in a conventional vertically stacked FET structure. Bottom contact 26, as depicted, connects to epi 24 on the side of bottom FET 3 and on a portion of the top surface of bottom FET 3. In this way, bottom contact 26 provides better contact resistance than conventionally formed bottom contacts that only connect to a small portion of the top of the bottom FET. Additionally, providing epitaxy on the sides and top of bottom FET 3, which can be heavily doped, further improves the electrical performance of the semiconductor structure depicted in FIG. 2 when compared to conventional stacked FETs. In some embodiments, bottom contact 26 connects to the side of bottom FET 3 and a portion of the top surface of bottom FET 3 when epi 24 is not formed on bottom FET 3.

Figure 3:
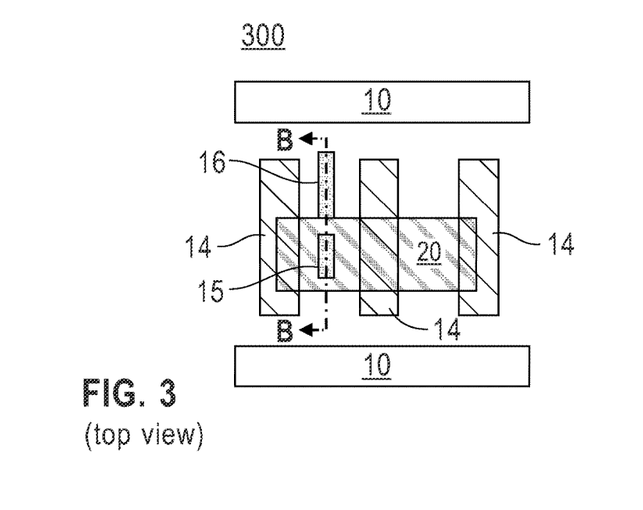
FIG. 3 is a top view of a semiconductor structure after forming contacts to two same width stacked field-effect transistors (FETs) in accordance with an embodiment of the present invention.

FIG. 3 is a top isometric view of semiconductor structure 300 after forming top contact 15 and bottom contact 16 connecting to top FET 20 and bottom FET 30 (not depicted) respectively in accordance with an embodiment of the present invention. As depicted, FIG. 3 includes power rail 10, gates 14, top contact 15, bottom contact 16, and top FET 20 as viewed through the interlayer dielectric and dielectric layer below top FET 20. Bottom FET 30 has the same width as top FET 20 and is below top FET 20 and for these reasons, bottom FET 30 is not depicted in FIG. 3. Power rail 10, gates 14, top contact 15, bottom contact 16, and top FET 20 are similar to or the same as power rail 1, gates 4, and top FET 2 discussed in detail with respect to FIG. 1 except that the width of top FET 20 and bottom FET 30 is the same so that bottom FET 30 is not depicted in FIG. 3.

Figure 4:
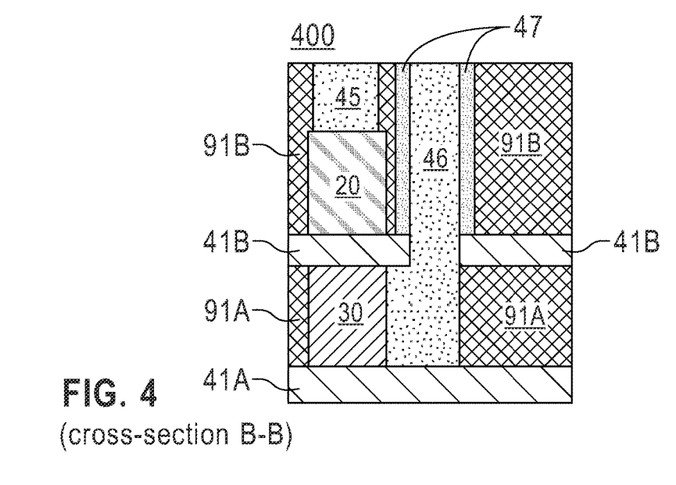
FIG. 4 is a cross-sectional view through B-B of the semiconductor structure of FIG. 3 in accordance with an embodiment of the present invention.

FIG. 4 is a cross-sectional view 400 through B-B of semiconductor structure 300 depicted in FIG. 3 in accordance with an embodiment of the present invention. As depicted, FIG. 4 includes top FET 20, bottom FET 30, dielectric layers 41A and 41B, top contact 45, bottom contact 46 with sidewall spacer 47 on a top portion of bottom contact 46, ILD 91A and 91B. As depicted, top FET 20 and bottom FET 30 have the same width and bottom contact 46 connects with the side of bottom FET 30. In various embodiments, a layer of doped epitaxy (not depicted in FIG. 4) is formed on the side of bottom FET 30 where bottom contact 46 connects to bottom FET 30. In other embodiments, top FET 20 and bottom FET 30 have a different width but are vertically aligned on the side where bottom contact 46 connects to bottom FET 30.

As depicted in FIG. 4, the bottom portion of bottom contact 46 adjacent to bottom FET 30 is wider than the top portion of bottom contact 46 that is adjacent to top FET 20 and dielectric layer 41B. In various embodiments, the height of the contact or connection area of bottom contact 46 to bottom FET 30 is the height of bottom FET 30. In this way, the contact area of contact 46 can be maximized and can be relatively large. The bottom surface of bottom contact 46 resides on dielectric layer 41A. In FIG. 4, bottom FET 30 also resides on dielectric layer 41A. In various embodiments, a small portion of ILD 91B resides between top FET 20 and sidewall spacer 47 surrounding the top portion of bottom contact 46. In other embodiments, a layer of epitaxy (not depicted in FIG. 4) is present between bottom contact 46 and bottom FET 30.

Figure 5:
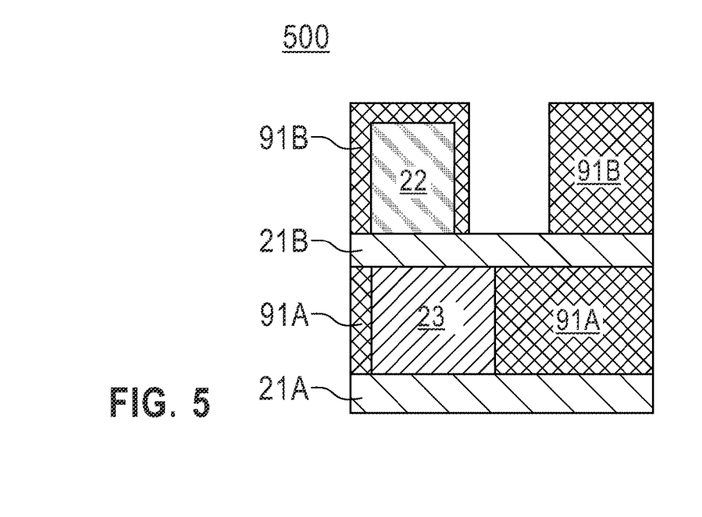
FIG. 5 is a cross-sectional view of a semiconductor structure after removing a portion of a top interlayer dielectric (ILD) in accordance with an embodiment of the present invention.

FIG. 5 is a cross-sectional view of semiconductor structure 500 after removing a portion of ILD 91B in accordance with an embodiment of the present invention. As depicted, the portion of ILD 91B is removed adjacent to top FET 22. As depicted, FIG. 5 includes top FET 22, bottom FET 23, dielectric layers 21A and 21B, ILD 91A and 91B where top FET 22 and bottom FET 23 are essentially the same or similar to top FET 2 and bottom FET 3 discussed in detail with respect to FIG. 1. Using known semiconductor processes for patterning and etching the portion of ILD 91B can be removed above a portion of dielectric layer 21B. As depicted, the portion of ILD 91B removed is above a portion of bottom FET 2. The etch of the portion of ILD 91B, for example using RIE, stops on dielectric layer 21B.

Figure 6:
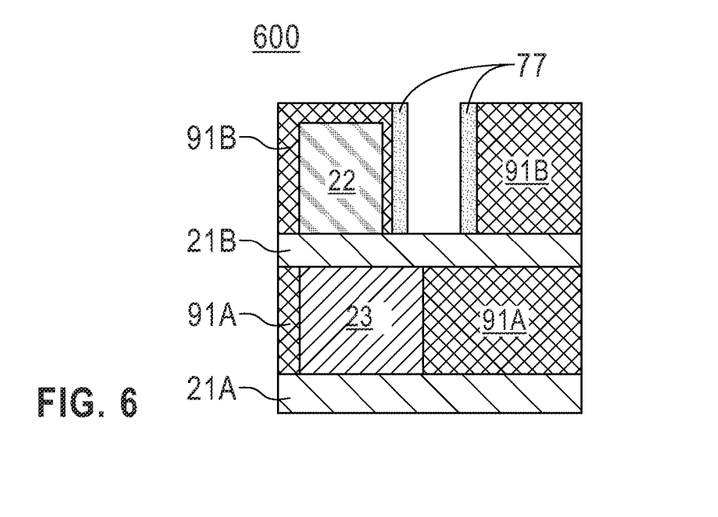
FIG. 6 is a cross-sectional view of the semiconductor structure after forming a sidewall spacer around the vertical walls of the removed portion of the ILD in accordance with an embodiment of the present invention.

FIG. 6 is a cross-sectional view of semiconductor structure 600 after forming sidewall spacer 77 around the exposed vertical walls of ILD 91B in accordance with an embodiment of the present invention. As depicted, FIG. 6 includes the elements of FIG. 5 and sidewall spacer 77. Sidewall spacer 77 may be formed using known spacer formation processes (e.g., dielectric material deposition, anisotropic etch, and an optional chemical-mechanical polish (CMP)). For example, the conformal deposition of the dielectric material for sidewall spacer 77 can occur using any suitable deposition technique including, but not limited to ALD, chemical vapor deposition (CVD), plasma-enhanced chemical vapor deposition (PECVD), physical vapor deposition (PVD), or other similar deposition processes. The deposited dielectric material for sidewall spacer 77 may be composed of any spacer material including any appropriate low-k dielectric material, such as SiBCN, SiOCN, SiCOH, and SiNCH material. After the dielectric material deposition, an anisotropic etch process, such as RIE, removes the dielectric material from the exposed horizontal surfaces to form sidewall spacer 77.

Figure 7:
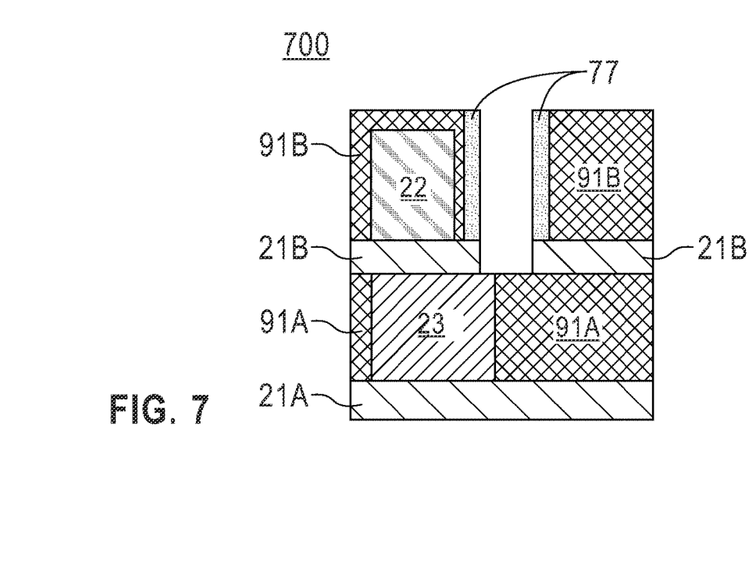
FIG. 7 is a cross-sectional view of the semiconductor structure after removing an exposed portion of a dielectric layer in accordance with an embodiment of the present invention.

FIG. 7 is a cross-sectional view of semiconductor structure 700 after removing the exposed portion of dielectric layer 21B in accordance with an embodiment of the present invention. As depicted in FIG. 7, include the elements of FIG. 6 with a portion of dielectric layer 21B removed. In FIG. 7, using known etching processes, such as RIE, the exposed portion of dielectric layer 21B is removed. In some embodiments, a single or one-step etching process removes both the portion of dielectric layer 21B and the portion of ILD 91A exposed under the removed portion of dielectric layer 21B that is adjacent to bottom FET 23. Using a one-step etch process can result in the semiconductor structure depicted in FIG. 8.

Figure 8:
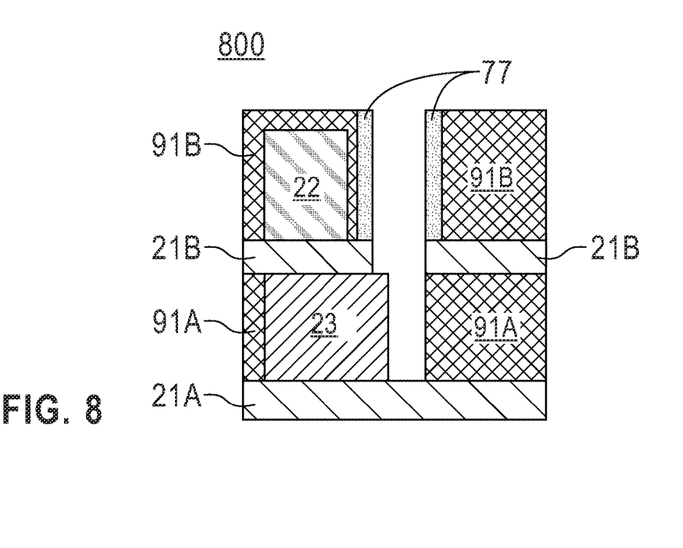
FIG. 8 is a cross-sectional view of the semiconductor structure after removing an exposed portion of a bottom layer of ILD in accordance with an embodiment of the present invention.

FIG. 8 is a cross-sectional view of semiconductor structure 800 after removing an exposed portion of ILD 91A in accordance with an embodiment of the present invention. As depicted, using known etching processes (e.g., RIE), the portion of ILD 91A under the removed portion of dielectric layer 21B, can be removed. The etch process stops on the top surface of dielectric layer 21A and on a portion of the top surface of bottom FET 23. After completing the etch of ILD 91A, a recess or trench is formed above a portion of bottom FET 23 and adjacent to bottom FET 23. A larger recess can be formed adjacent to top FET 22. The recess, as depicted, extends down through dielectric layer 21B, ILD 91A, over a portion of bottom FET 23 and along an outer vertical edge of bottom FET 23. The bottom portion of the recess or hole adjacent to bottom FET 23 is narrower than the top portion of the hole adjacent to top FET 22. The bottom, narrower portion of the hole is over a portion of the top surface of bottom FET 23 and is along a vertical edge of bottom FET 23.

Figure 9:
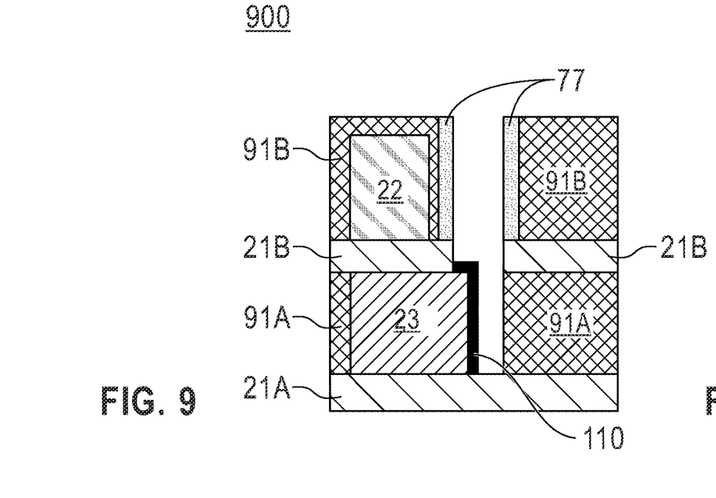
FIG. 9 is a cross-sectional view of the semiconductor structure after forming epitaxy on the exposed surfaces of the bottom FET in accordance with an embodiment of the present invention.

FIG. 9 is a cross-sectional view of semiconductor structure 900 after forming epi 110 on the exposed surfaces of bottom FET 23 in accordance with an embodiment of the present invention. As depicted, FIG. 9 includes the elements of FIG. 8 and epi 110. Growing epi 110, as depicted in FIG. 9, is an optional step and may not be done in some embodiments of the present invention. Using known epitaxially growth processes, a layer of epi 110 can be formed on the exposed top and side surfaces of bottom FET 23. In some embodiments, epi 110 is a heavily doped layer of epitaxy. For example, epi 110 may be doped with boron when bottom FET 23 is a PFET. As previously discussed, epi 110 can improve the electrical performance of the stacked FETs (e.g., epi 110 can provide a lower contact resistivity).

Figure 10:
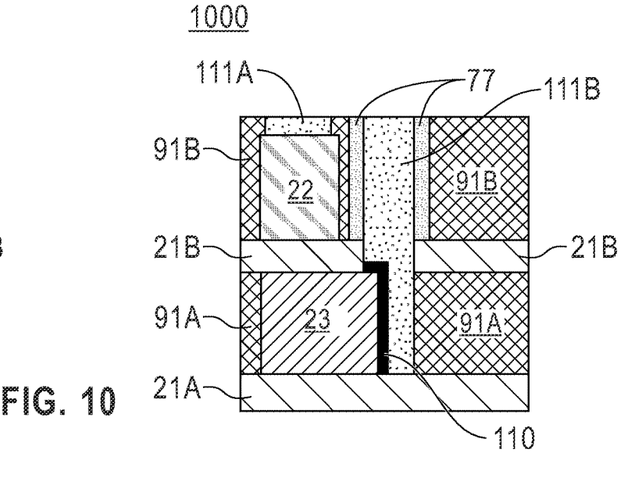
FIG. 10 is a cross-sectional view of the semiconductor structure after removing a second portion of the top ILD and depositing a contact material over exposed surfaces of the top and the bottom FET in accordance with an embodiment of the present invention.

FIG. 10 is a cross-sectional view of semiconductor structure 1000 after removing a second portion of ILD 91B over top FET 22 and depositing a contact material over exposed surfaces of top FET 22, epi 110, ILD 91B, and dielectric layer 21A in accordance with an embodiment of the present invention. As depicted, FIG. 10 includes dielectric layer 21A and 21B, top FET 22, bottom FET 23, epi 110, sidewall spacer 77, ILD 91A and 91B, and top contact 111A and bottom contact 111B after performing a chemical mechanical polish (CMP) to remove the excess contact material above ILD 91B.

In FIG. 10, a contact material, such as but not limited to Ti, TiN, W, or Co, can be deposited in the recesses formed above top FET 22 and on the exposed portions of dielectric layer 21A and epi 110 to form top contact 111A and epi 110 on bottom contact 111B, respectively. In some embodiments, bottom contact 111B connects directly to the exposed portions of the top surface and the side of bottom FET 23 when epi 110 is not present.

Bottom contact 111B, as depicted in FIG. 10, provides a larger contact area and connection to bottom FET 23 than is typically provided with conventionally stacked FETs. In conventionally stacked FETs with a larger bottom FET, the bottom contact only connects a small portion of the top surface of the bottom FET (i.e., the bottom contact does not connect to a side of the bottom FET). As depicted, in FIG. 10, in various embodiments of the present invention, bottom contact 111B contacts epi 110 on both the exposed sides of bottom FET 23 and on a portion of the top surface of bottom FET 23. Additionally, as previously discussed, the width of bottom contact 111B can be greater than the width of a bottom contact in a conventionally stacked FET structure. Based at least in part, on the wider bottom contact 111B compared to conventional contacts to a bottom FET in conventional, vertically stacked FET, semiconductor structure 1000 depicted in FIG. 10 can provide improved electrical performance for the stacked FET devices (e.g., a larger, wider contact with more contact area and lower resistivity than a conventional contact in conventionally stacked FET devices). As previously discussed, when epi 110 is heavily doped epi 110, the bottom contact resistance can be further reduced. The heavily doped epi 110 can further improve the electrical performance of stacked semiconductor devices.

Figure 11:
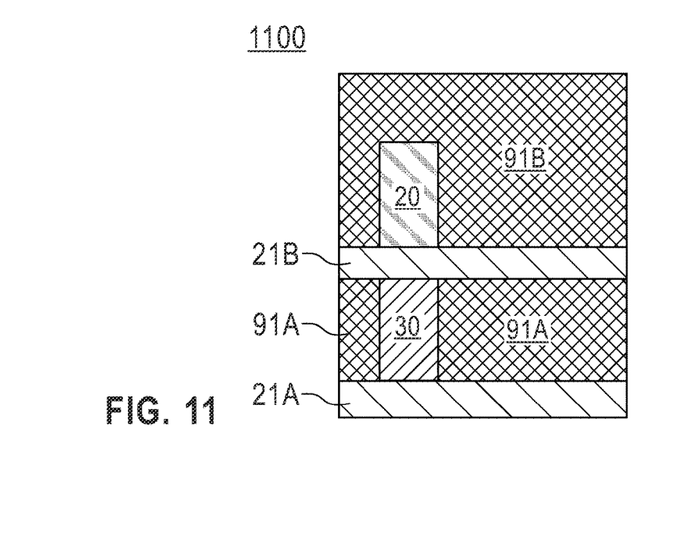
FIG. 11 is a cross-sectional view of a semiconductor structure with two vertically stacked FETs with the same diameter in accordance with an embodiment of the present invention.

FIG. 11 is a cross-sectional view of semiconductor structure 1100 with two vertically stacked semiconductor devices with the same diameter in accordance with an embodiment of the present invention. As depicted, FIG. 11 includes dielectric layer 21A and 21B, top FET 20, bottom FET 30, ILD 91A, and 91B where top FET 20 and bottom FET 30 have the same diameter or width. In FIG. 11, top FET 20 has the same size and is directly over bottom FET 30. As previously discussed, in some embodiments, the top semiconductor device is a memory device rather than a FET and similarly, in other embodiments, the bottom semiconductor device is a memory device. In other embodiments, more than two stacked semiconductor devices are present. In this case, the stacked semiconductor devices can be logic devices, memory devices, or a mix of logic and memory devices.

Figure 12:
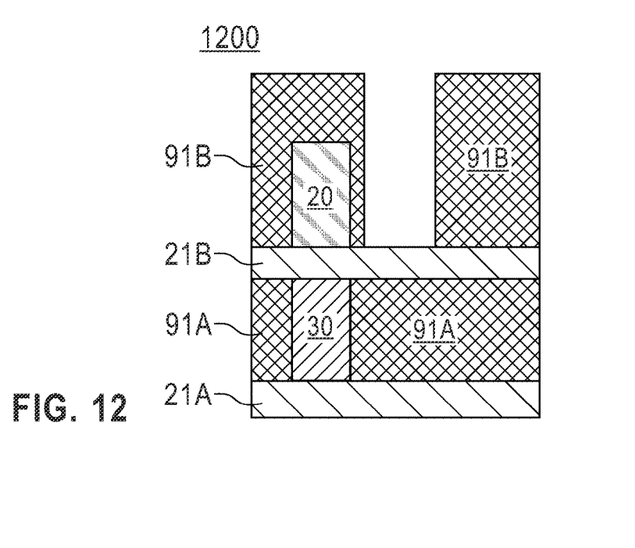
FIG. 12 is a cross-sectional view of the semiconductor structure after removing a portion of the ILD in accordance with an embodiment of the present invention.

FIG. 12 is a cross-sectional view of semiconductor structure 1200 after removing a portion of ILD 91B in accordance with an embodiment of the present invention. As depicted, the portion of ILD 91B is removed adjacent to top FET 20 and above a portion of dielectric layer 21B. In various embodiments, a thin sliver of ILD 91B is between the etched hole and top FET 20. Dielectric layer 21B can act as an etch stop for the etching process (e.g., RIE or other suitable etch process). FIG. 12 includes top FET 20, bottom FET 30, dielectric layer 21A, dielectric layer 21B, ILD 91A, and ILD 91B.

Figure 13:
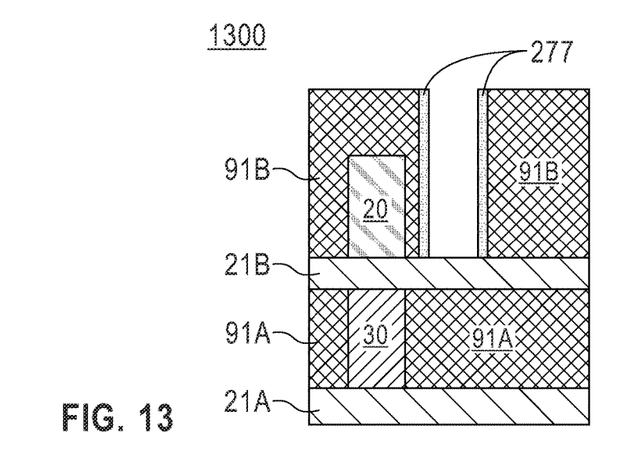
FIG. 13 is a cross-sectional view of a semiconductor structure after forming a sidewall spacer in the recess etched in the ILD in accordance with an embodiment of the present invention.

FIG. 13 is a cross-sectional view of semiconductor structure 1300 after forming sidewall spacer 277 in the hole or recess formed by the removal of the portion of ILD 91B in accordance with an embodiment of the present invention. As depicted, FIG. 13 includes the elements of FIG. 12 with the addition of sidewall spacer 277. Sidewall spacer 277 may be formed with the same or similar materials and processes as discussed in detail previously with respect to FIG. 6.

Figure 14:
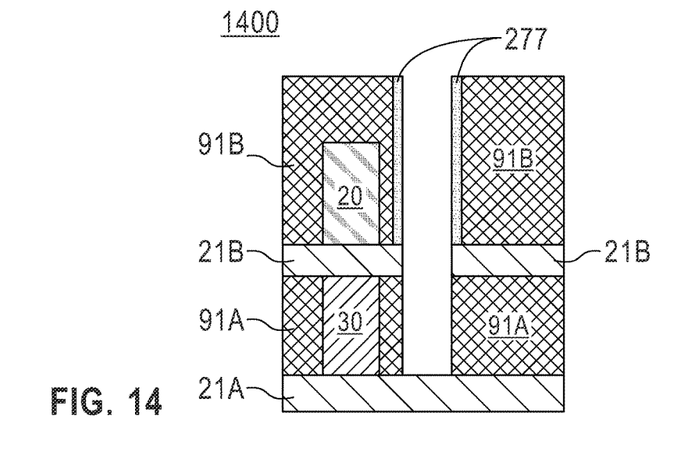
FIG. 14 is a cross-sectional view of the semiconductor structure after removing an exposed portion of the dielectric layer and the ILD in accordance with an embodiment of the present invention.

FIG. 14 is a cross-sectional view of semiconductor structure 1400 after removing an exposed portion of dielectric layer 21B and ILD 91A in accordance with an embodiment of the present invention. As depicted, the exposed portion of dielectric layer 21B and exposed portion of ILD 91A under the removed dielectric layer 21B can be removed using one or more etching processes such as but not limited to RIE. In some cases, a two step etch process can be used. In this case, a first etch process removes the exposed portion of dielectric layer 21A followed by a second etch of the exposed portion of IL D 91A under the removed portion of dielectric layer 21B. In the second etch process, dielectric layer 21A can act as an etch stop. In other cases, a single etch process may be used to remove both the portions of dielectric layer 21B and ILD 91B. As depicted, after the etch of dielectric layer 21B and ILD 91A, a thin portion of ILD 91A separates the recess or hole formed in FIG. 12 from bottom FET 30.

Figure 15:
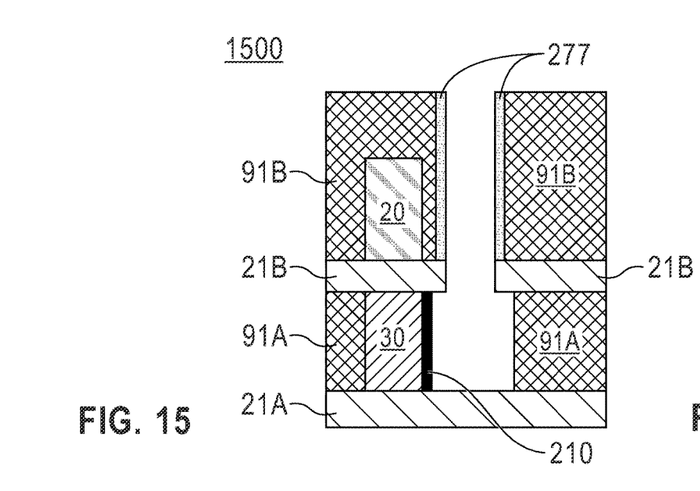
FIG. 15 is a cross-sectional view of the semiconductor structure after performing a lateral etch of the bottom ILD and growing epitaxy on the bottom FET in accordance with an embodiment of the present invention.

FIG. 15 is a cross-sectional view of semiconductor structure 1500 after performing a lateral etch of ILD 91A and growing epi 210 in accordance with an embodiment of the present invention. As depicted, a lateral etch process, which can be either a dry etch or a wet chemical etch, widens the hole or trench in ILD 91A below dielectric layer 21B such that the hole extends to a side of bottom FET 30. Using the lateral etch process, horizontal portions of ILD 91A are removed until the lateral etch process exposes a side of bottom FET 30.

In various embodiments, epi 210 is grown on the exposed vertical side of bottom FET 30. Epi 210 can be grown with the processes and materials previously discussed and known to one skilled in the art. The epitaxial growth is an optional step. In some embodiments, epi 210 is not grown and contact 211B will connect directly to the exposed side of bottom FET 30 (not depicted in FIG. 15). In some embodiments, epi 210 is heavily doped using known epitaxy doping processes and materials.

Figure 16:
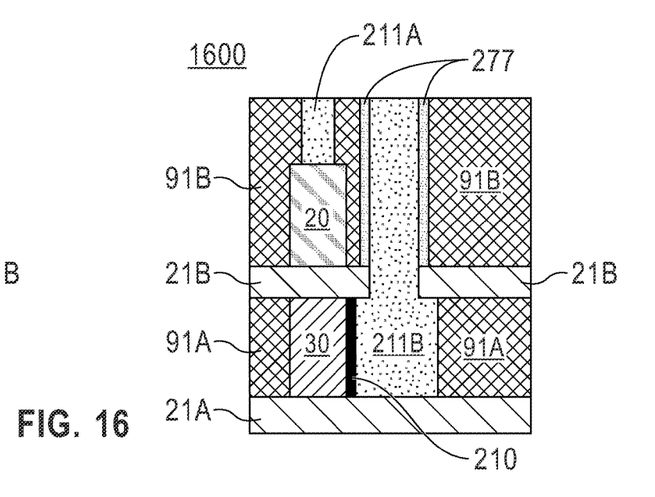
FIG. 16 is a cross-sectional view of the semiconductor structure after etching a second hole in the ILD above the top FET and depositing a contact material forming the contacts to the top FET and the bottom FET in accordance with an embodiment of the present invention.

FIG. 16 is a cross-sectional view of semiconductor structure 1600 after etching a second hole in ILD 91B above top FET 20 and depositing a contact material in accordance with an embodiment of the present invention. As depicted, FIG. 16 includes contacts 211A and 211B, top FET 20, bottom FET 30, sidewall spacer 277, dielectric layer 21A and 21B, ILD 91A and 91B where top FET 20 and bottom FET 30 have the same width.

Using a known lithographic and etch process, a hole is etched in ILD 91B above top FET 20. Then, using a deposition process, such as but not limited to CVD, ALD, or PVD deposition of a contact material (e.g., Ti, TiN, W, etc.), the two holes formed in may be filled to create contacts 211A and 211B. A CMP can be performed to remove excess contact material above ILD 91B. The contact material can be deposited over the semiconductor structure forms contact 211A to top FET 20 and contact 211B to bottom FET 30. As depicted in FIG. 16, contact 211A connects to a top surface of top FET 20 and contact 211B, formed in ILD 91A using a lateral etch process, epitaxially growth for epi 210 on the exposed surface of bottom FET 30, and contact material deposition, connects to epi 210 on a side of bottom FET 30. In some cases, contact 211B connects to a side of bottom FET 30 when no epi 210 is present (not depicted in FIG. 16).

Contact 211B extends horizontally to connect with a side of epi 210 on bottom FET 30 or, in some embodiments without epi 210, contact 211B connects with a side of bottom FET 30. As previously discussed, epi 210 can be heavily doped (e.g., with an n-type or p-type dopant). Epi 210 may improve the electrical performance of the stacked FET devices by lowering the contact resistance for contact 211B. Additionally, using the lateral etch process and conformal contact material deposition to form contact 211B provides a way to create a stacked FET structure with two same sized stacked FETs. Sidewall spacer 277 on the top portion of contact 211B can provide, at least in part, the electrical isolation of top FET 20 and contact 211B. As previously discussed with respect to FIG. 10 and as known by one skilled in the art, using variations of the above process steps, a stacked semiconductor structure composed of more than two stacked semiconductor devices may be formed. The stacked semiconductor devices can be stacked logic devices (e.g., FETs), stacked memory devices, or a mix of stacked logic and memory devices.

The methods, as described herein, can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor structure composed of stacked semiconductor devices, the semiconductor structure comprising:
   a top semiconductor device on a dielectric material layer, wherein the top semiconductor device is encapsulated in a top interlayer dielectric;
   a bottom semiconductor device under the top semiconductor device, wherein the bottom semiconductor device is wider than the top semiconductor device, wherein the bottom semiconductor device includes a layer of epitaxy on a portion of a top surface of the bottom semiconductor device and a vertical side of the bottom semiconductor device, wherein the layer of epitaxy is between the bottom semiconductor device and a bottom contact, wherein a top surface of the layer of epitaxy is wider than a bottom surface of the layer of epitaxy; and
   the bottom contact connecting to a portion of the top surface and the vertical side of the bottom semiconductor device.

2. The semiconductor structure of claim 1, wherein the bottom semiconductor device includes the layer of epitaxy on the portion of the top surface of the bottom semiconductor device connecting to the bottom contact.

3. The semiconductor structure of claim 2, wherein the layer of epitaxy on the portion of the top surface and the side of the bottom semiconductor device is doped.

4. The semiconductor structure of claim 1, wherein the top semiconductor device and the bottom semiconductor device are one or more of logic devices or memory devices.

5. The semiconductor structure of claim 1, wherein the top semiconductor device and the bottom semiconductor device are field-effect transistors.

6. The semiconductor structure of claim 4, wherein a top portion of the bottom contact is surrounded by a sidewall spacer.

7. The semiconductor structure of claim 1, wherein the top semiconductor device includes a top contact connecting to a portion of a top surface of the top semiconductor device.

8. A semiconductor structure composed of stacked semiconductor devices, the semiconductor structure comprising:
- a top semiconductor device on a dielectric material layer, wherein the top semiconductor device is encapsulated in a top interlayer dielectric;
- a bottom semiconductor device under the top semiconductor, wherein the bottom semiconductor device and the top semiconductor device have a same width, wherein the bottom semiconductor device includes a layer of epitaxy on a portion of a top surface of the bottom semiconductor device and a vertical side of the bottom semiconductor device, wherein the layer of epitaxy is between the bottom semiconductor device and a bottom contact, wherein a top surface of the layer of epitaxy is wider than a bottom surface of the layer of epitaxy; and
- the bottom contact connecting to the vertical side of the bottom semiconductor device.

9. The semiconductor structure of claim 8, wherein the bottom semiconductor device further comprises the layer of epitaxy on the side of the bottom semiconductor device that contacts the bottom contact.

10. The semiconductor structure of claim 9, wherein the layer of epitaxy on the side of the bottom semiconductor device is doped with one of an n-type dopant or a p-type dopant.

11. The semiconductor structure of claim 8, wherein the top semiconductor device and the bottom semiconductor device are one of logic devices, memory devices, or a combination of a logic device and a memory device.

12. The semiconductor structure of claim 8, wherein the top semiconductor device with a top contact and the bottom semiconductor device are field-effect transistors.

13. The semiconductor structure of claim 8, wherein a top portion of the bottom contact adjacent to the top semiconductor device is surrounded by a sidewall spacer.

14. The semiconductor structure of claim 13, wherein the sidewall spacer is separated from the top semiconductor device by an interlayer dielectric material.

15. The semiconductor structure of claim 8, wherein a bottom portion of the bottom contact is wider than a top portion of the bottom contact.

16. The semiconductor structure of claim 10, wherein the top semiconductor device on the dielectric material layer is a p-type FET device and the bottom semiconductor device is an n-type device with the layer of epitaxy on the side of the bottom semiconductor device that has the n-type dopant.

* * * * *